United States Patent
Park et al.

(10) Patent No.: US 7,485,006 B2
(45) Date of Patent: Feb. 3, 2009

(54) MEMORY MODULE, SOCKET AND MOUNTING METHOD PROVIDING IMPROVED HEAT DISSIPATING CHARACTERISTICS

(75) Inventors: Sang-Wook Park, Seongnam-si (KR); Joong-Hyun Baek, Suwon-si (KR); Hae-Hyung Lee, Suwon-si (KR); Hee-Kook Choi, Seoul (KR); Jin-Yang Lee, Suwon-si (KR)

(73) Assignee: Samsung Electronics Co. Ltd., Gyeonggi-do (KR)

( * ) Notice: Subject to any disclaimer, the term of this patent is extended or adjusted under 35 U.S.C. 154(b) by 7 days.

(21) Appl. No.: 11/093,236

(22) Filed: Mar. 30, 2005

(65) Prior Publication Data

US 2005/0245137 A1 Nov. 3, 2005

(30) Foreign Application Priority Data

Mar. 31, 2004 (KR) .................. 10-2004-0022027

(51) Int. Cl.
*H01R 24/00* (2006.01)
(52) U.S. Cl. ..................................... 439/637
(58) Field of Classification Search .................. 439/637
See application file for complete search history.

(56) References Cited

U.S. PATENT DOCUMENTS

| | | | | |
|---|---|---|---|---|
| 5,751,553 A * | 5/1998 | Clayton | ....................... | 361/749 |
| 6,002,589 A * | 12/1999 | Perino et al. | ................ | 361/749 |
| 6,234,820 B1 * | 5/2001 | Perino et al. | ................ | 439/326 |
| 6,341,966 B1 * | 1/2002 | Takada et al. | ............... | 439/108 |
| 6,449,159 B1 * | 9/2002 | Haba | ......................... | 361/707 |
| 7,029,324 B2 * | 4/2006 | Annequin | .................. | 439/579 |
| 7,122,889 B2 * | 10/2006 | Belgacem | ................. | 257/696 |
| 2004/0241417 A1 * | 12/2004 | Fischer et al. | ............ | 428/317.9 |

FOREIGN PATENT DOCUMENTS

| KR | 2000113920 | 4/2000 |
|---|---|---|
| KR | 20-0203858 | 9/2000 |
| KR | 10-0338225 | 5/2002 |

\* cited by examiner

*Primary Examiner*—Briggitte R Hammond
(74) *Attorney, Agent, or Firm*—Harness, Dickey & Pierce PLC

(57) ABSTRACT

In a memory module, a gap filler for eliminating an air gap may be formed on an end of a PCB where a tab may be formed. The gap filler may be formed on a surface of a socket receiving the memory module. A grease may be coated on the tab to provide a heat conduction path away from the memory module.

18 Claims, 10 Drawing Sheets

MEMORY MODULE, SOCKET AND MOUNTING METHOD PROVIDING IMPROVED HEAT DISSIPATING CHARACTERISTICS

BACKGROUND OF THE INVENTION

This application claims the benefit of priority of Korean Patent Application No. 2004-22027, filed on Mar. 31, 2004, in the Korean Intellectual Property Office, the disclosure of which is incorporated herein in its entirety by reference.

FIELD OF THE INVENTION

The present invention relates generally to a semiconductor device, a socket for mounting the semiconductor device and a semiconductor device mounting method, and more particularly to a memory module, a socket and a mounting method.

DESCRIPTION OF THE RELATED ART

Semiconductor devices such as DRAMs (for example) may be implemented in a memory module. A memory module may have a plurality of semiconductor devices that may be mounted on a printed circuit board. An electrical characteristic of a DRAM device may be refresh characteristics, which may deteriorate at elevated temperatures. Thus, it may be advantageous to dissipate heat generated from a memory module.

For example, a refresh characteristic of a DRAM memory module may degraded at a temperature of 80° C. and higher, which may unexpectedly increase an inferior refresh rate. Therefore, cooling may be a technique for decreasing the inferior refresh rate when using a memory module.

Figure 1:
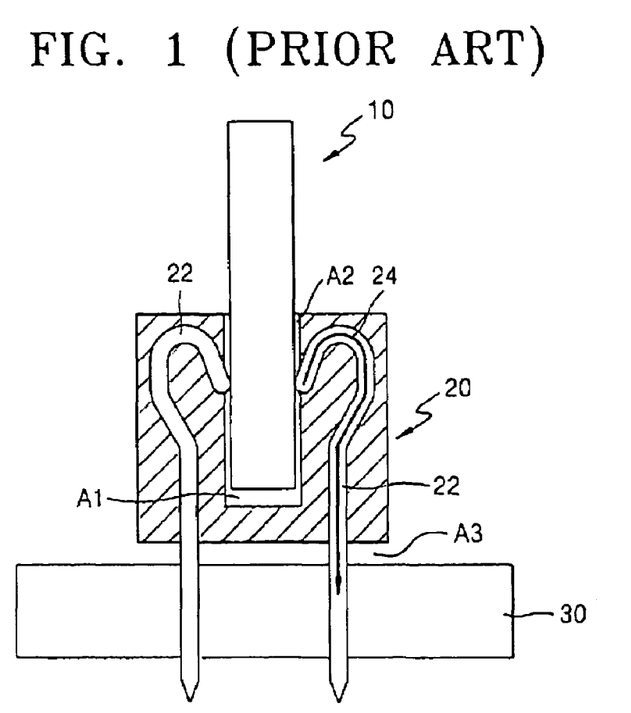
FIG. 1 is a sectional view of a prior art memory module mounted in a prior art socket.

FIG. 1 is a sectional view of a conventional memory module and a socket that may be mounted on the memory module.

Referring to FIG. 1, a memory module 10 may be inserted into a socket 20 installed on a mother board 30. Conventionally, the socket 20 may be installed on the mother board 30 for achieving an electrical connection between the memory module 10. However, as a general trend, a packing density and an operating speed of a DRAM device (not shown) included in the memory module 10 may be increasing. Accordingly, the memory module 10 may generate enough heat to degrade the performance of the DRAM device included in the memory module 10. Although the socket 20 may provide an appropriate electrical connection, it is not without shortcomings. For example, the socket 20 may present a barrier against heat flow away from the DRAM. That is, only a small amount of heat may be conducted from the memory module 10 to the socket 20. And this heat may tend to accumulate in the socket 20, as opposed to being conducted through the socket 20 and away from the DRAM.

Heat may not be sufficiently conducted away from the memory module 10 for the following reasons. Air is an extremely poor thermal conductor, even when present in a tightly confined space. And with reference to FIG. 1, air gaps exist between the socket 20 and the memory module 10, as well as the socket 20 and the mother board 30. Namely, an air gap A1 exists between a lower end of the memory module 10 and the socket 20 and air gaps A2 exist along sides of the memory module 10 and the socket 20. An air gap A3 also exists between the socket 20 and the mother board 30.

Furthermore, a small contact between the memory module 10 and a socket pin 22 of the socket 20 and a lengthy thermal conduction path that externally spreads the heat transferred from the socket pin 22 may hinder the socket 20 from externally spreading the heat generated from the DRAM.

SUMMARY OF THE INVENTION

Exemplary embodiments of the present invention may provide a memory module with a structure that may dissipate heat generated from a semiconductor device mounted within the memory module.

Exemplary embodiments of the present invention may provide a socket with a structure that may dissipate heat generated from a semiconductor device mounted within a memory module.

Exemplary embodiments of the present invention may provide a mounting method, in which the heat generated from a semiconductor device mounted within the memory module may be dissipated.

In an example embodiment, a memory module may include a printed circuit board (PCB). A tab may be provided on an end of the PCB, and a semiconductor device may be mounted on the PCB. A gap filler may be attached to the end of the PCB provided with the tab.

The gap filler may be fabricated from a gel material. A projecting portion may be provided on the tab. The projecting portion may obstruct intrusion of external foreign materials when the PCB is inserted into the socket.

In another example embodiment, a socket may include a housing main body. A module inserting portion may be provided in the housing main body. At least one socket pin may be provided in the housing main body. The socket pin may have an intermediate section confronting the module inserting portion of the housing main body. A gap filler may be provided on a surface of the module inserting portion.

The gap filler may be fabricated from a gel material.

The housing main body may have a covering portion formed on an inlet of the module inserting portion.

The housing main body may have a filler provided on a surface of the housing main body that faces away from the module inserting portion. The filler may be one of an epoxy material, a Thermal Interface Material (TIM) tape and a tape having adhesion that is reinforceable by heat.

In another example embodiment, a socket may include a housing main body. A module inserting portion may be provided in the housing main body. An elastic material may fill a space between the module inserting portion and the housing main body. At least one socket pin may be provided in the housing main body. The socket pin may include a linear portion confronting the module inserting portion. A socket pin lever may extend from the socket pin. The socket pin lever may influence the linear portion of the socket pin toward the module inserting portion. A Thermal Interface Material (TIM) layer may be provided on a surface of the socket pin lever confronting the module inserting portion.

The linear portion of the socket pin may have a length within a range of 2~6 mm, and a width of the socket pin lever may be less than one half of a width of the socket pin.

In another example embodiment, a mounting method may involve mounting a socket on a mother board. A gap filler may be coated over a tab of a memory module. The memory module may be inserted into the socket.

The method may further involve providing a gap filler on at least one of the memory module and a surface of the socket. The method may further involve providing one of an epoxy and a TIM layer between the socket and the mother board.

The method may also involve at least one of providing a projecting portion on the memory module and providing a cover on the socket.

According to the present invention, structures of a memory module and a socket may reduce and/or eliminate an air gaps that may otherwise exist between the socket and the memory module. Therefore, factors liable to be a barrier to dissipating heat from a semiconductor device mounted on the memory module may be reduced, if not altogether eliminated. A grease may be used when inserting the memory module into a socket, so that heat may be effectively dissipated externally. By doing so, degradation of electrical characteristics of the semiconductor device mounted on the memory module may be improved.

BRIEF DESCRIPTION OF THE DRAWINGS

Numerous and varied features of the present invention may become more apparent from the description of the exemplary embodiments that follows, with reference to the attached drawings.

DETAILED DESCRIPTION OF EXEMPLARY, NON-LIMITING EMBODIMENTS OF THE INVENTION

Exemplary, non-limiting embodiments of the present invention will now be described more fully with reference to the accompanying drawings. The invention may, however, be embodied in many different forms and should not be construed as being limited to the embodiments set forth herein; rather these embodiments are provided so that this disclosure will be thorough and complete, and will fully convey the concept of the invention to those skilled in the art. The principles and features of this invention may be employed in varied and numerous embodiments without departing from the scope of the invention.

In this disclosure, well-known structures and processes may not be described or illustrated in detail to avoid obscuring the present invention. Furthermore, the figures are not drawn to scale. Rather, for simplicity and clarity of illustration, the dimensions of some of the elements may be exaggerated relative to other elements. A layer may be considered as being formed (or otherwise provided) "on" another layer or a substrate when formed either directly on the referenced layer or the substrate or formed (or otherwise provided) on other layers or patterns overlaying the referenced layer or the substrate. Like reference numerals are used for like and corresponding parts of the various drawings.

Figure 2:
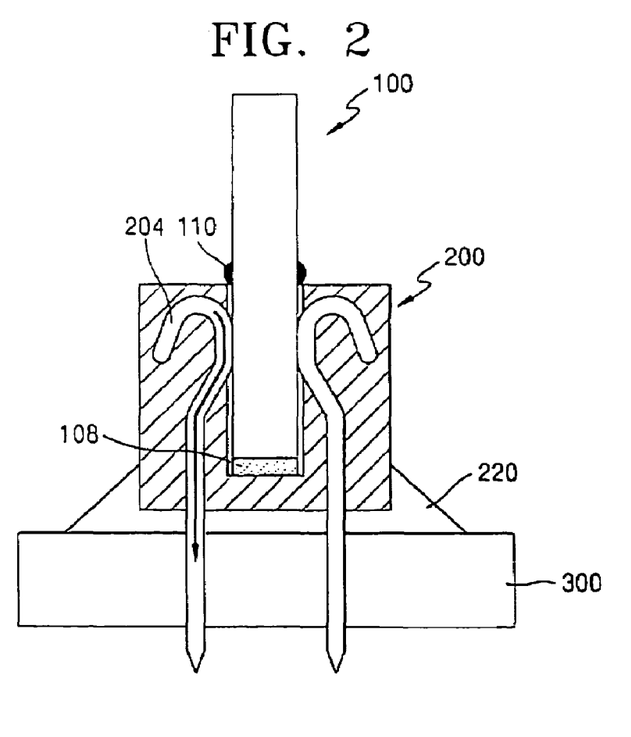
FIG. 2 is a sectional view of a memory module mounted in a socket according to an exemplary embodiment of the present invention.

FIG. 2 is a sectional view of a memory module mounted in a socket according to an exemplary embodiment of the present invention.

Referring to FIG. 2, a socket 200 may be installed on a mother board 300. An under-fill material may be interposed between the socket 200 and the mother board 300. In this example embodiment, the under-fill material may be an epoxy 220. A memory module 100 may be inserted into the socket 200. A gap filler 108 may be provided on an end of the memory module 100 so that the gap filler 108 may contact a bottom surface of the socket 200. A projection 110 may be provided on a surface of the memory module 100 in contact with a module inserting portion of the socket 200. The gap filler 108 may fill the air gap that may otherwise exist between the memory module 100 and the socket 200 (e.g., see the air gap A1 in FIG. 1), and the projection 110 may hinder intrusion of external foreign materials into the socket 200.

The presence of the gap filler 108 and the epoxy 220 may increase the conduction of heat away from a semiconductor device (e.g., a DRAM device), as compared to conventional structures in which air gaps may exist between the memory device and the socket and/or the socket and the mother board. In other words, the gap filler 108 and the epoxy 220 may fill air gaps, thereby allowing the heat generated from the DRAM to be more effectively spread outward.

Figure 3:
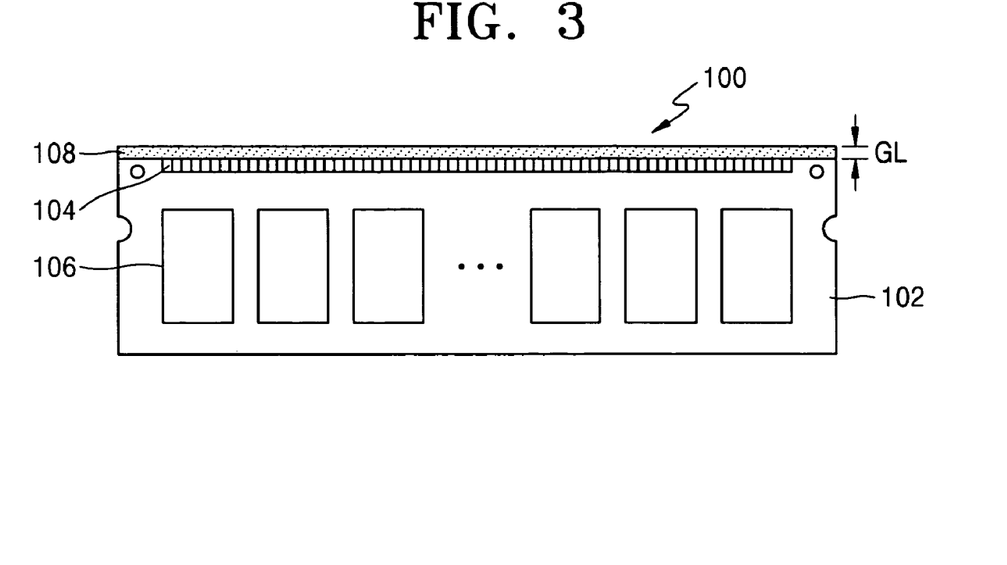
FIG. 3 is a plan view of the memory module according to an exemplary embodiment of the present invention.

FIG. 3 is a plan view of the memory module according to an exemplary embodiment of the present invention.

Referring to FIG. 3, the memory module 100 may include a printed circuit board (PCB) 102. A tab 104, which may provide an external circuit connection point, may be formed on an end of the PCB 102. A semiconductor device 106 may be mounted on the PCB 102. The gap filler 108 may be bonded to the end of the PCB 102 supporting the tab 104.

The PCB 102 may be a rigid type substrate composed of FR4 (for example), or a flexible type substrate composed of polyimide (for example). The invention is not limited in this regard, however, since the PCB 102 may be fabricated from numerous, alternative materials. The semiconductor device 106 may be provided in the form of a semiconductor package and/or a wafer lever package. However, it will be appreciated that the semiconductor device may be suitably implemented in numerous, alternative forms that are well known in this art. The semiconductor device 106 may function as a DRAM. The semiconductor device 106 may be attached on both sides of the PCB 102. The semiconductor device 106 may also be attached to only one side of the PCB 102. Here, the PCB 102 may perform functions other than those that may be provided by a DRAM.

The gap filler 108 may be fabricated from a material that may fill gaps existing between the memory module and the socket. By way of example only, and not as a limitation of the invention, a suitable material may be a gel material. It will be appreciated, however, that the gap filler 108 may be fabricated from numerous, alternative materials. The presence of the gap filler 108 may facilitate heat conduction away from the memory module 100, and thus may restrain a temperature rise of the memory module 100 that may otherwise occur. By way of example only, the gap filler 108 may have a thickness GL within a range of 0.1~0.4 mm using a polymer-based material. Also, either a silica-based filler or an aluminum oxide-based filler may be added to enhance the thermal conduction effect of the gap filler 108. The gap filler 108 may be of an alternative thickness, fabricated from alternative materials, and combined with alternative filler materials.

Figure 4:
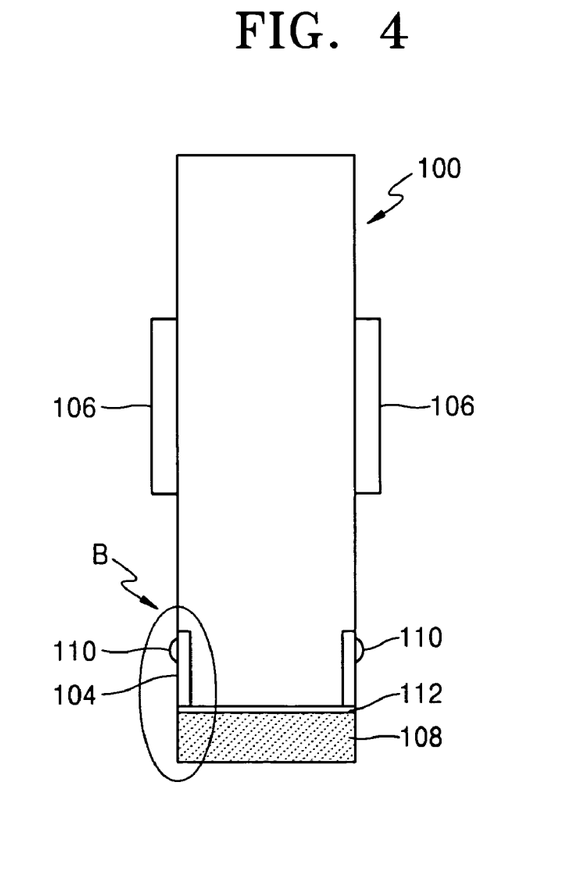
FIG. 4 is a side view of the memory module according to an exemplary embodiment of the present invention.

The gap filler 108 may be bonded to the PCB 102 using an epoxy-based adhesive 112 (as shown in FIG. 4, for example). The gap filler 108 may not bond to the socket when the memory module 100 is inserted into the socket.

FIG. 4 is a side view of the memory module according to an exemplary embodiment of the present invention.

Referring to FIG. 4, the memory module 100 may have the projection 110, which may inhibit external foreign materials from intruding into the socket. The projection 110 may have a symmetrical, curved profile as shown, but the invention is not limited in this regard; i.e., the projection may have an asymmetrical shape and have numerous alternative profiles. Moreover, the projections provided on a particular memory module may be of a uniform shape or varied shapes. The tab 104 may be coated with a thermal grease when the memory module 100 is inserted into the socket, which will be described later in detail. The projection 110 may deter degeneration of the thermal grease that may otherwise occur due to external foreign materials contaminating the inside of the socket. Example projections will be described with reference to FIGS. 5 and 6, respectively, which are enlarged views of a portion B shown in FIG. 2.

Figure 5:
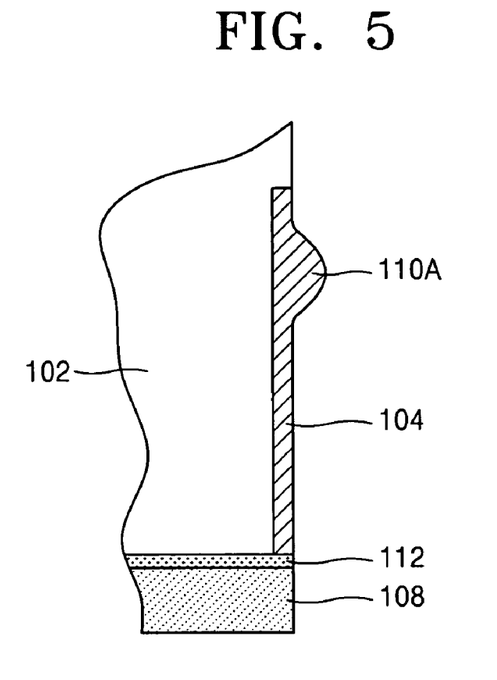
FIGS. 5 and 6 are sectional views respectively illustrating example projections that may be implemented in the memory module shown in FIG. 2.
Figure 6:
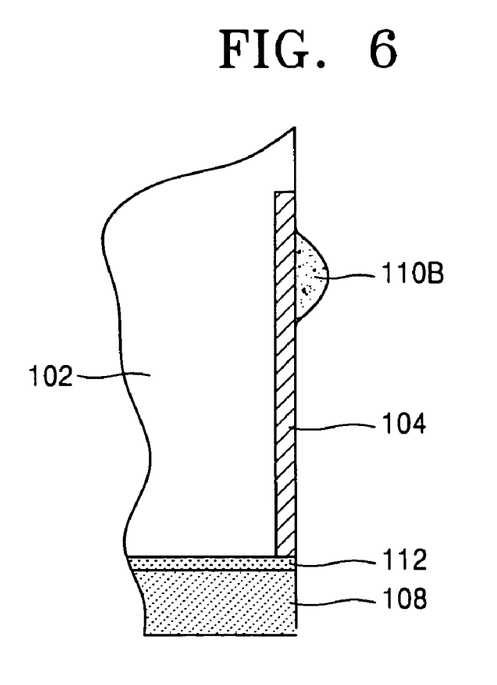

Referring to FIG. 5, a projecting portion 110A may be formed by protruding a PCB pattern, which may be composed of copper (for example) existing in the PCB 102. The Cu-containing PCB pattern may have the partially protruded portion, which may not affect other electrical characteristics of the PCB pattern. The projecting portion 110A may enhance the reliability in contacting a socket pin. Referring to FIG. 6, a projecting portion 110B may be formed using a different material, such as polymer (for example). The memory module 100 may block an inlet of the module inserting portion after the memory module 100 is inserted into the socket, and thus may obstruct the intrusion of foreign materials into the socket. The projecting portion 110B fabricated from polymer may be relatively soft (as compared to a metal such as the PCB pattern), and thus may be more effective in hindering the intrusion of the foreign materials.

Figure 7:
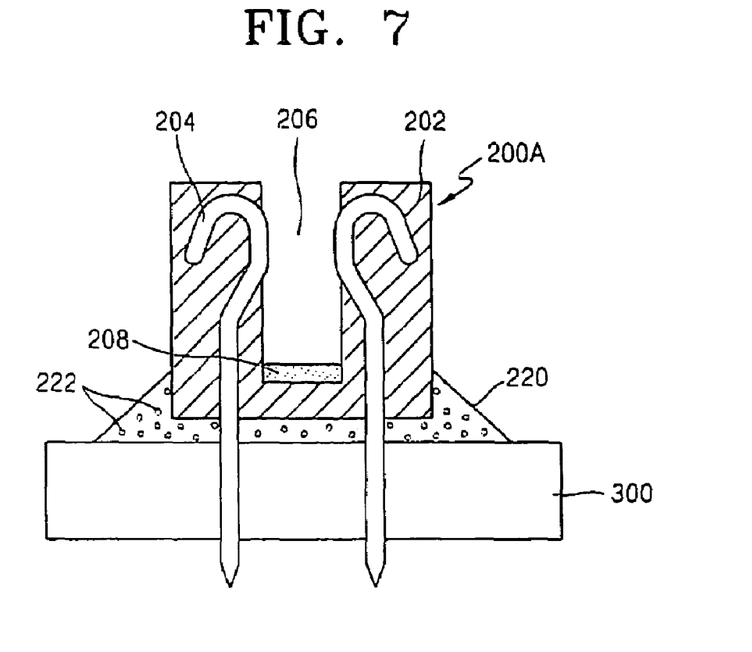
FIG. 7 is a sectional view of a socket according to an exemplary embodiment of the present invention.

FIG. 7 is a sectional view of a socket according to an exemplary embodiment of the present invention.

Referring to FIG. 7, a socket 200A may include a housing main body 202. The housing main body 202 may be fabricated from an insulating material, and may have a structure into which the memory module may be inserted. A module inserting portion 206, through which the memory module may be inserted, may be formed in the house main body 202. A plurality of socket pins 204 may be provided on both sides of the module inserting portion 206. The socket pins 204 may be arranged to provide a relatively short path (as compared to conventional arrangements) through which heat generated from the memory module may be conducted externally out of the housing main body 202. Furthermore, a gap filler 208 may be formed on a surface of the module inserting portion 206 of the housing main body 202.

The socket 200A may include an under-fill material. By way of example only, and not as a limitation of the invention, the under-fill material may be an epoxy 220. The epoxy 220 may be provided on the housing main body 202. The epoxy 220 may fill an air gap that may otherwise exist between the socket 200A and the mother board 300. The epoxy 220 may have an insulating property and/or a hardening property. Any one of a silica filler, an aluminum nitride filler, an aluminum oxide filler, and a carbon fiber filler may be added to the epoxy 220 to increase a thermal conduction property of the epoxy. The epoxy 220 may be combined with alternative fillers.

The gap filler 208 may function similarly to the gap filler 108 formed on the memory module 100 shown in FIG. 3. However, the gap filler 208 may be formed on the socket, instead of the memory module 100. Similar to the gap filler 108 shown in FIG. 3, the gap filler 208 may be fabricated from numerous materials, include numerous and alternative filler materials, and be of numerous thicknesses The gap filler 208 may be bonded to a surface of the module inserting portion 206 using an epoxy-based adhesive. The gap filler 208 may not bond to the inserted memory module.

Figure 8A:
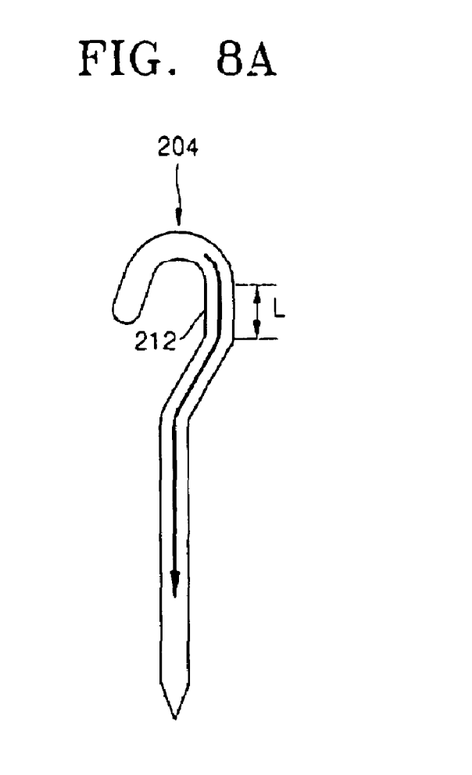
FIGS. 8A and 8B are sectional views of socket pins according to an example embodiment of the present invention and the prior art, respectively.
Figure 8B:
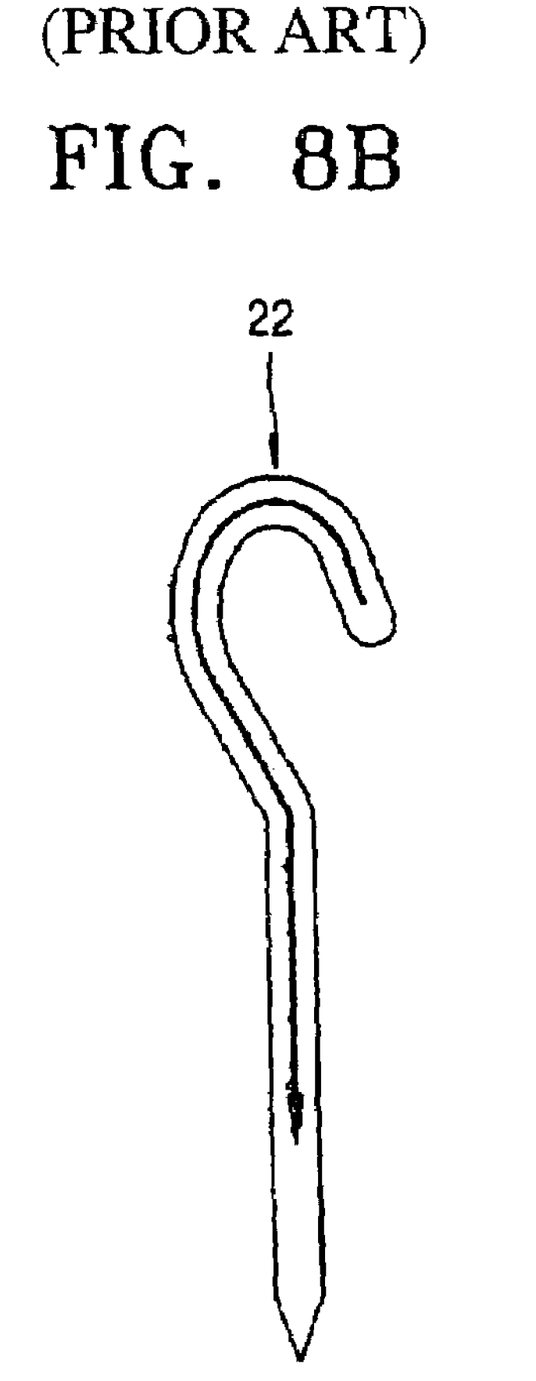

FIGS. 8A and 8B are sectional views of socket pins according to an exemplary embodiment of the present invention and the prior art, respectively.

FIG. 8A shows an example socket pin 204 that may be suitably implemented in the socket 200A depicted in FIG. 7 (for example), and FIG. 8B shows a prior art socket pin 22 that may be implemented in the prior art socket depicted in FIG. 1. With reference to FIG. 8A, the socket pin 204 may have a shape and orientation that provides a relatively short heat conduction path (as compared to the prior art socket pin 22 of FIG. 8B) from the tab of the memory module to the outside of the socket. In FIGS. 8A and 8B, the conduction paths are indicated via arrows extending along the respective socket pins.

Turning briefly to FIG. 7, an intermediate portion of the socket pin may confront the module inserting portion 206, and thus the intermediate portion of the socket pin may contact with the tab of the memory module. Further, and turning back to FIG. 8A, the intermediate portion of the socket pin 204 confronting the module inserting portion may include a linear portion 212. By virtue of the linear portion 212, the socket pin 204 may contact with the tab along a contacting length L. The linear portion 212 may be formed by performing a coining treatment on the socket pin 204. By way of example only, the linear portion 212 may have a length L in the range of 2~4 mm.

In contrast, and turning briefly to FIG. 1, an end of the prior art socket pin 22 may confront the module inserting portion, and thus the end of the prior art socket pin 22 may contact with the memory module 10. Accordingly, the heat conduction path may extend from one end of the socket pin 22 to the other. Further, the end of the socket pin 22 may not include a linear portion along which the socket pin 22 may contact with the memory module 10.

Figure 9:
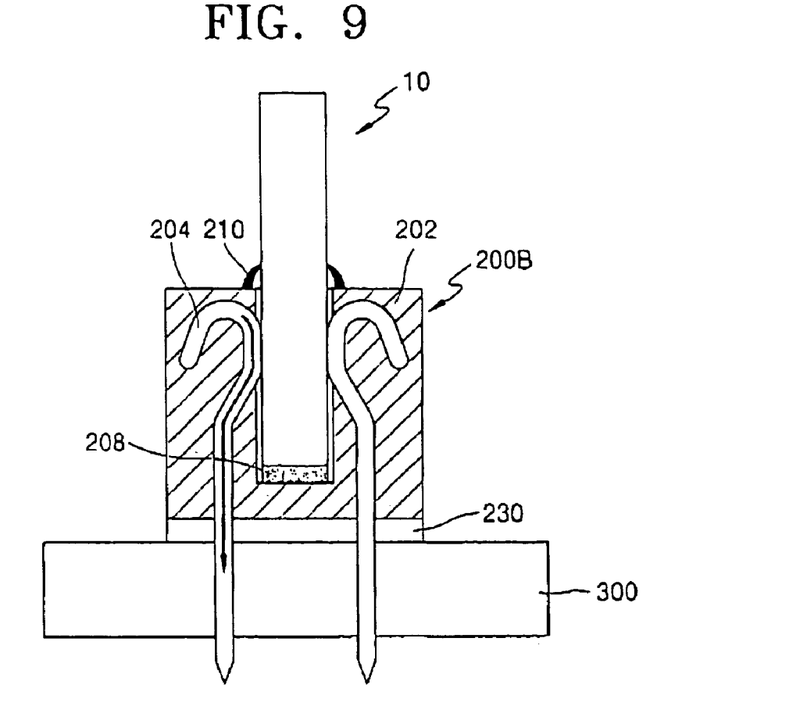
FIG. 9 is a sectional view of a socket according to another exemplary embodiment of the present invention.

FIG. 9 is a sectional view of a socket according to another exemplary embodiment of the present invention.

With reference to FIG. 9, a tape 230 (instead of the epoxy 220 shown in FIG. 7) may be interposed between the socket 200B and the mother board 300. The tape 230 may be composed of thermal interface materials (TIMs), which may be thermally conductive. The tape 230 may have two sides with adhering characteristics, but the invention is not limited in this regard. The tape 230 may facilitate the socket 200B being attached/detached to/from the mother board 300. The tape 230 may be fabricated from numerous and varied TIMs that are well known in this art. Suitable TIMs may have better heat conducting properties than air and/or the material of the socket main body.

A thermal bonding tape, which may have adhesion characteristics reinforced by heat, may be used instead of the tape 230 composed of TIMs. Generally, the mother board 300 may be designed to endure a high heat. Therefore, the socket 200B may be bonded to the mother board 300 via thermal compression after coating the tape with a bonding force that may be strengthened at a temperature of about 70° C. and higher. The socket pin 204 may be connected by soldering. By doing so, formation of an air gap between the socket 200B and the mother board 300 may be further reduced.

A covering portion 210 may be provided on the housing main body 202. The covering portion 210 may inhibit the intrusion of external foreign materials into the socket 200B when the memory module 10 is inserted. It will be appreciated that the covering portion 210 may also be provided on the socket 200A shown in FIG. 7. The covering portion 210 may be composed of a smooth and flexible material that may facilitate the insertion of the memory module.

Figure 10:
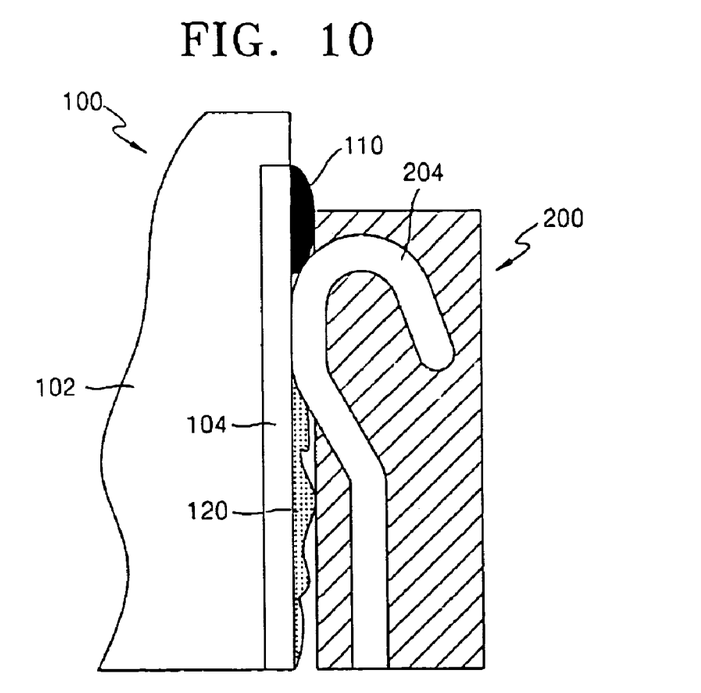
FIGS. 10 and 11 are sectional views illustrating a mounting method according to an exemplary embodiment of the present invention.
Figure 11:
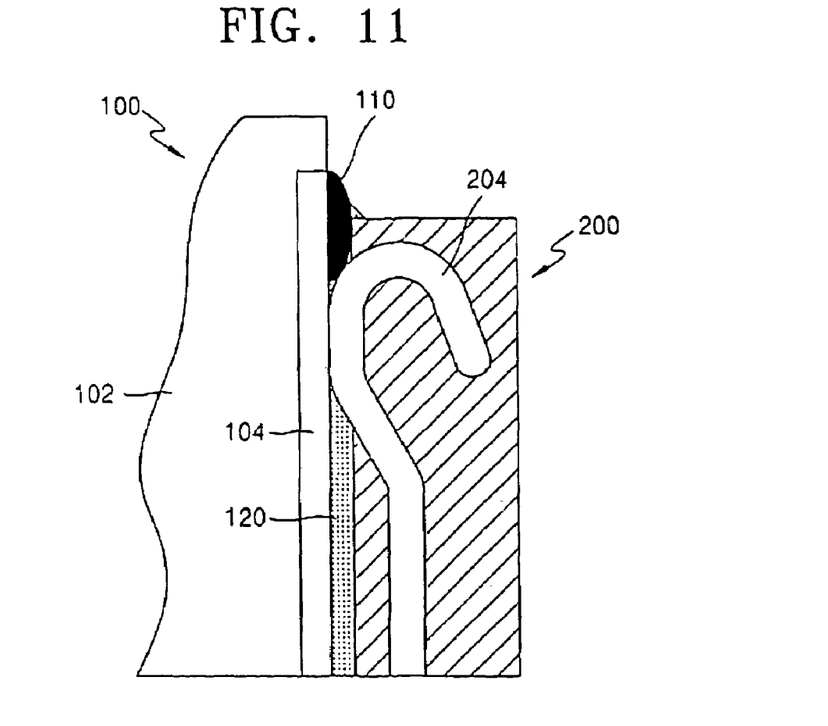

FIGS. 10 and 11 are sectional views illustrating a memory module mounting method according to an exemplary embodiment of the present invention.

The socket may be mounted on the mother board. Here, an epoxy (e.g., the epoxy 220 shown in FIG. 7) or a tape (e.g., the tape 230 shown in FIG. 9) may be provided to fill the air gap that may otherwise occur between the socket and the mother board. The socket 200A of FIG. 7 or the socket 200B of FIG. 9 may be suitably implemented. Since a gap filler 208 may be provided in the socket, a memory module having no gap filler may be suitably implemented. For example, as shown in FIG. 9, the conventional memory module 10 may be installed in the example socket of the present invention. However, the invention is not limited in this regard since the example memory modules 100 of FIGS. 2-4 may also be installed in the example socket.

The tab 104 of the memory module may be coated with a grease 120. The grease 120 may contain thermally conductive materials and may have a high viscosity. The memory module and the socket may be electrically connected together via the interaction between the tab 104 and the socket pin. The grease 120 may provide a heat conduction path away from the memory module. The projections 110 on the memory module 100 may protect the grease 120 from becoming contaminated with debris from the outside. When the installed memory module does not include projections (e.g., the conventional memory module 10), the covering portion 210 (see FIG. 9, for example) may be provided on the housing main body 202 of the socket 200A or 200B to protect the grease 120 from becoming contaminated with debris from the outside.

The grease 120 may fill air gaps that may otherwise exist between the memory module and the socket; for example, see the air gaps A2 in FIG. 1. The gap filler 208 disposed on the socket may also fill air gaps that may otherwise exist between the memory module and the socket; for example, see the air gap A1 in FIG. 1.

As discussed above, prior art memory modules 10 (see FIG. 1), which may not have a gap filler and/or projections, may be suitably installed in example sockets according to the present invention, which may have a gap filler and/or projections. However, the invention is not limited in this regard since example memory modules according to the present invention (as shown in FIGS. 2-4), which may have a gap filler and/or projections, may be suitably installed in prior art sockets 20 (see FIG. 1).

As described above, the socket may be mounted on the mother board in a manner that may reduce the formation of air gaps between the mother board and the socket. To this end, an epoxy (e.g., the epoxy 220 of FIG. 7) or a tape (e.g., the tape 230 of FIG. 9) may be used as filler to fill the air gaps that may otherwise occur. The filler may be fabricated from numerous and varied materials that are well known in this art.

The tab 104 of the memory module 100 may be coated with the grease 120. The grease 120 may fill the air gaps (e.g., A2 of FIG. 1) that may otherwise exist between the memory module and the socket. The gap filler (108 of FIG. 4) disposed on the tab 104 may fill the air gaps (e.g., A1 of FIG. 1) that may otherwise exist between the memory module and the socket.

Structure may be provided to obstruct the intrusion of external foreign materials into the inside of the socket. For example, the structure may include the projection 110 provided on the memory module and/or the covering portion 210 provided on the socket. Example embodiments of the invention my implement the socket pin 204 of FIG. 8A and/or the prior art socket pin 22 of FIG. 8B. FIG. 10 shows a state before the grease 120 has stabilized, and FIG. 11 shows a state in which the grease 120 has stabilized, which may occur with the lapse of time.

Figure 12:
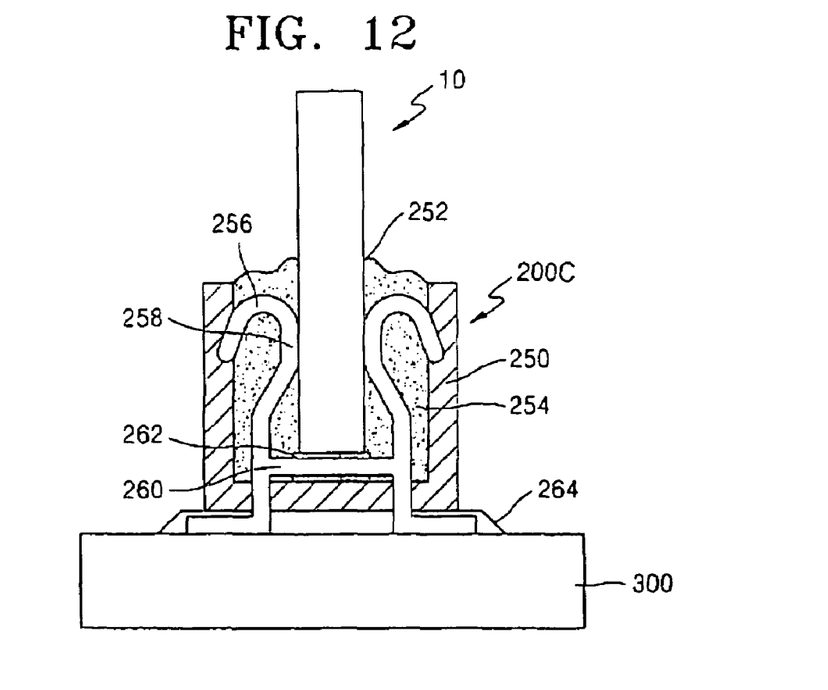
FIG. 12 is a sectional view of a socket according to another exemplary embodiment of the present invention.

FIG. 12 is a sectional view of a socket according to another exemplary embodiment of the present invention.

Referring to FIG. 12, the socket 200C may include a housing main body 250. The housing main body 250 may be fabricated from an insulating material. A module inserting portion 252, into which the memory module may be inserted, may be formed in the housing main body 250. An elastic material 254 may fill a space between the module inserting potion 252 and the housing main body 250. Socket pins 256 may be provided in two rows opposite to each other along both sides of the module inserting portion 252. The socket pins 256 may provide a heat conduction path through which heat may be conducted away from the memory module. One end of the socket pin 256 may be exposed to the outside of the housing main body 250. The socket pin 256 may include a linear portion 258 confronting the module inserting portion 252. The linear portion 258 may make contact with the tab of the memory module. In this example embodiment, a prior art memory module 10 (which may not include a gap filler) may be inserted into the socket 200C.

The socket 200C may include a socket pin lever 260. The socket pin lever 260 may extend from the lower portion of the socket pin 256. The socket pin lever 260 may extend between opposed socket pins 256. The module inserting portion 252 may be superposed over the socket pin lever 260. When the memory module 10 is inserted into the socket 200C, the memory module 10 may bottom out (and press) against the socket pin lever 260, which in turn may influence the linear portion 258 of the socket pin 256 inwardly and against the memory module 10. A TIM layer 262 may be formed on a surface of the socket pin lever 260 in contact with the memory module 10. The TIM layer 262 may provide a heat conduction path away from the memory module 10.

The elastic material 254 may improve the thermal conduction effect via the socket pins 256 since the elastic material 254 may press against the memory module 10. That is, the elastic material 254 may reduce the formation of air gaps that may otherwise occur between the socket and the memory module. The elastic material 254 may be fabricated from a material such as elastomer, epoxy-based resin, polyimide-based resin polymer, and fluoride-based resin polymer, for example. The invention is not limited in this regard, however, since the elastic material 254 may be fabricated from other, alternative materials.

The socket pin 256 may have a shape and orientation that provides a relatively short heat conduction path (as compared to conventional socket pins), as described above with respect to FIG. 8A. The externally exposed portion of the socket pin 256 may be bent so as to enlarge a surface contact area with the mother board 300. The socket pin 256 may be bonded on the surface of the mother board 300 without being inserted into a through hole formed in the mother board. The socket pin 256 may effectively conduct heat away from the memory module 10.

Figure 13:
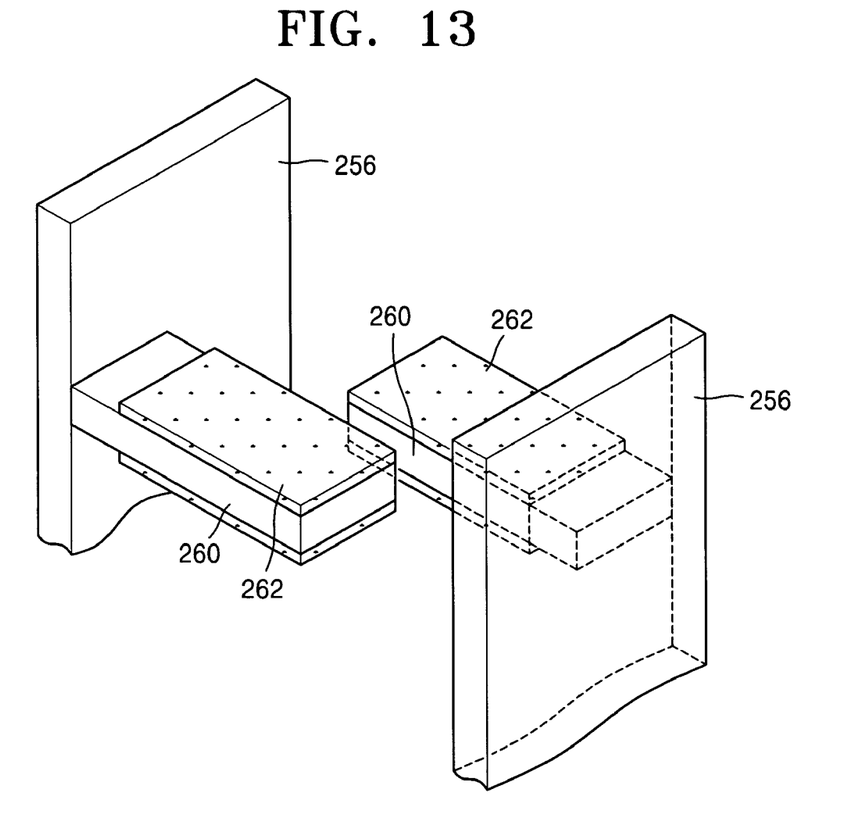
FIG. 13 is a partial perspective view of a socket according to another exemplary embodiment of the present invention.
Figure 14:
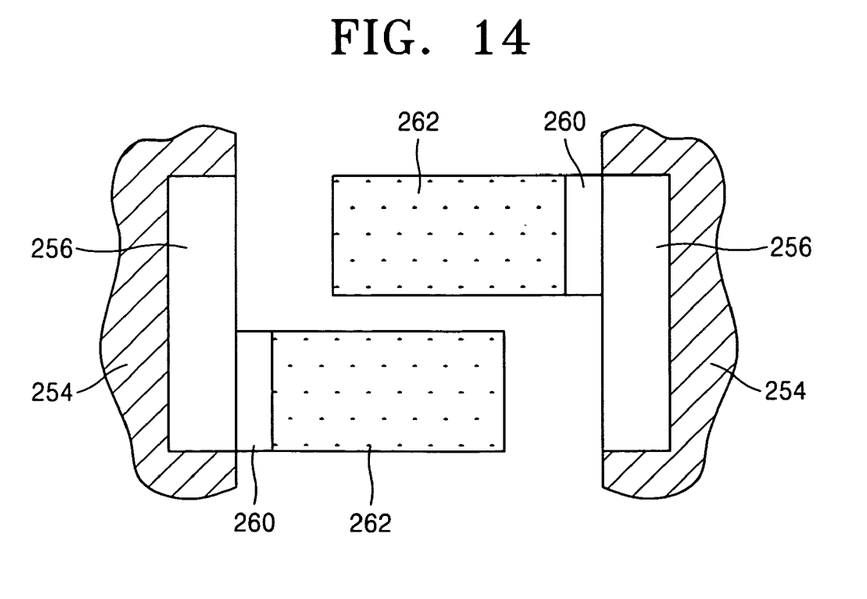
FIG. 14 is a partial plan view of the socket depicted in FIG. 13.

FIG. 13 is a perspective view illustrating a lever and a TIM layer of a socket according to another exemplary embodiment of the present invention, and FIG. 14 is a plan view of the same.

Referring to FIGS. 13 and 14, the socket pin lever 260 may extend from the lower portion of the socket pin 256. In this example embodiment, the socket pin lever 260 may extend at a right angle from the lower portion of the socket pin 256. The socket pin lever 260 may be coated with the TIM layer 262 on both sides thereof. Heat generated by the memory module may be conducted along a path formed by the TIM layer 262, the socket pin lever 260 and the portion of the socket pin 256 mounted on the mother board 300.

The socket pin lever 260 may have a width that is less than half the width of the socket pin 256, as shown in FIG. 14. Respective socket pin levers 260 may face each other without be electrically connected together. When the memory module is inserted into the socket, it may press against (and influence) the socket pin levers 260 to move in a direction toward the mother board 300. Here, the socket pin levers 260 may move independently of each other. It will be appreciated that the invention is not limited to the specific details illustrated in FIGS. 13 and 14. For example, the socket pin lever 260 need not have a rectangular shape (as shown in FIG. 14), but instead may be suitably implemented having other geometrical shapes. Further, the socket pin levers 260 of a single socket may be of a uniform shape, or have varied shapes from one socket pin lever to the next.

Figure 15:
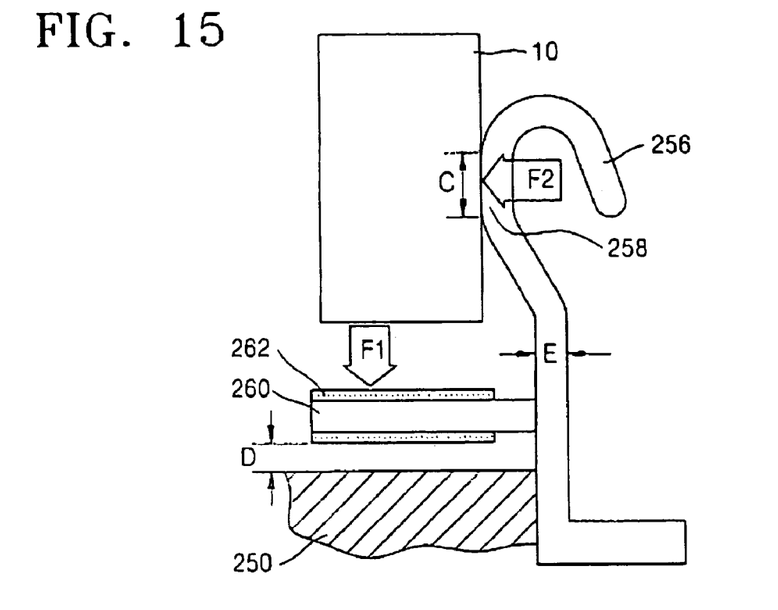
FIG. 15 is a sectional view of a memory module mounting method according to another exemplary embodiment of the present invention.

FIG. 15 is a sectional view illustrating an operation of the socket pin according to another exemplary embodiment of the present invention.

Referring to FIG. 15, the portion of the socket pin 256 contacting the memory module 10, may be subjected to a coining process (for example) for creating the linear portion 258. By way of example only, and not as a limitation of the invention, a length C of the linear portion 258 may be adjusted within a range of 2~6 mm, and the socket pin 256, except for the portion contacting the memory module 10, may have a thickness E of 3~5 mm.

The socket pin lever 260, which may be coated with the TIM layer 262, may be space apart a slight interval D from a surface of the housing main body 250. The interval D may range within 1 mm, but the invention is not limited in this regard. When a force F1 is exerted by the insertion of the memory module 10, the socket pin lever 260 may be pressed and moved through a distance as great as the interval D. The movement of the socket pin lever 260 may cause the linear portion 258 of the socket pin to press against the memory module with a force F2. Consequently, the electrical connection between the linear portion 258 of the socket pin 256 and the memory module 10 may be enhanced.

Figure 16:
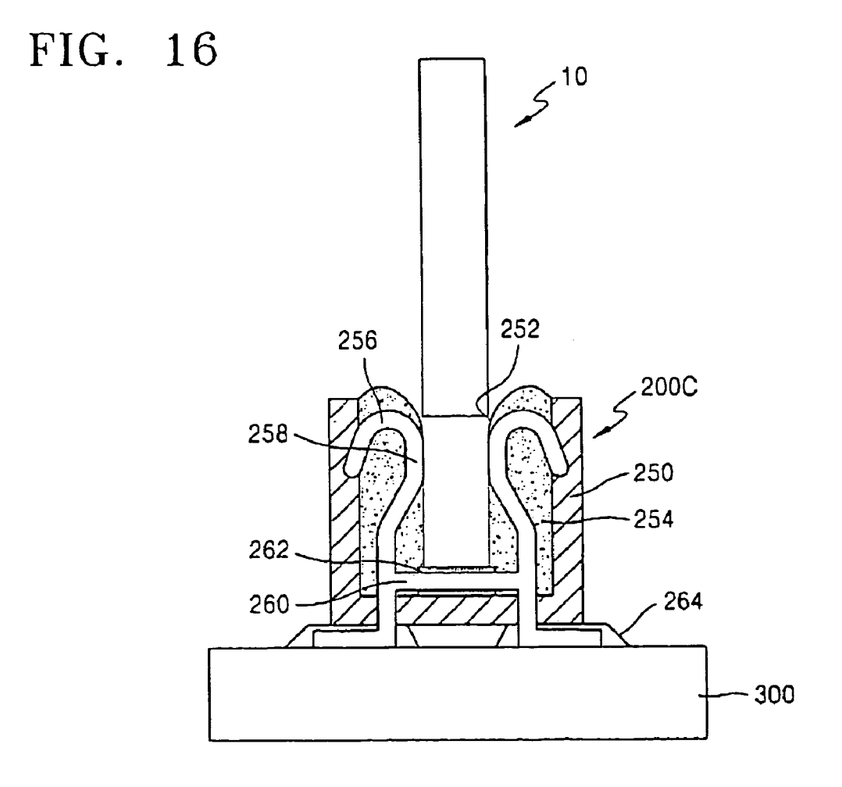
FIGS. 16 and 17 are sectional views of a memory module mounting method according to another exemplary embodiment of the present invention.
Figure 17:
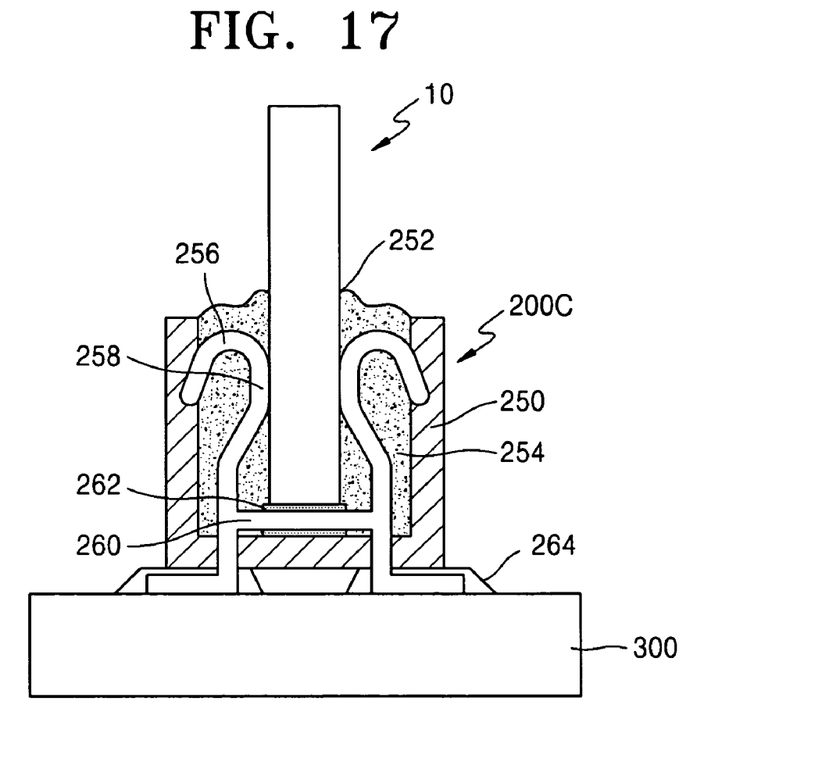

FIGS. 16 and 17 are sectional views illustrating an insertion of a memory module into a socket according to another exemplary embodiment of the present invention.

Referring to FIGS. 16 and 17, the memory module 10 may not have a gap filler that is inserted through the module inserting portion 252 of the socket 200C. As described above, the socket 200C may effectively conduct heat away from the memory module 10 by virtue of the shape and orientation of the socket pin 256, the action of the socket pin lever 260 and the TIM layer 262, and the function of the elastic material 254.

When the memory module 10 is inserted into the module inserting portion 252, the shape of the elastic material 254 may change to fit closely around the memory module 10. The close fit may reduce an air gap, which is a poor thermal conductor, and the heat generated by the memory module 10 may be effectively conducted via the TIM layer 262, the socket pin lever 260 and the socket pin 256. A solder 264 may be used for attaching the socket pin 256 to the mother board 300.

Figure 18:
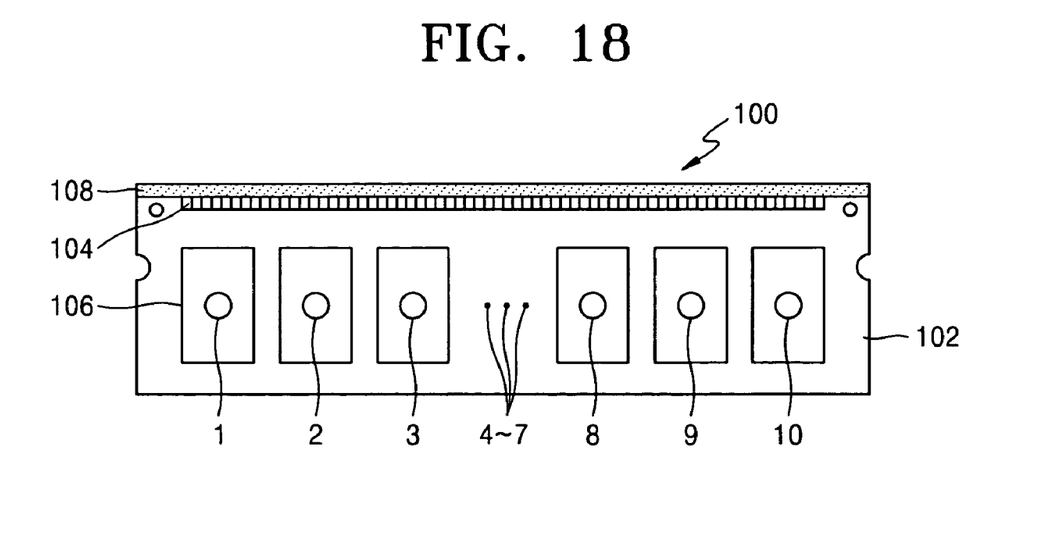
FIG. 18 is a plan view of a memory module for illustrating effects of exemplary embodiments of the present invention.

FIG. 18 is a plan view of the memory module for illustrating an effect of exemplary embodiments of the present invention.

Referring to FIG. 18, ten thermo couples, which are temperature measuring units, may be provided on the DRAM devices 106, which are mounted on the PCB 102. The memory module 100 may be inserted into the prior art socket 20 of FIG. 1. At this time, a microprocessor (CPU) with an operating speed of 2.1 GHz may be operated on the mother board, and the memory module 100 may be a Dual-In line Memory Module (DIMM) with a memory capacity of 2 GB. The DIMM may be operated together with the microprocessor.

During a first test, the temperatures are measured at ten points by the thermo couples when the memory module is operated together with the microprocessor. Here, a gap filler is not provided on the memory module. During a second test, the temperatures at ten points are measured by the thermo couples when the memory module is operated together with the microprocessor. Here, the gap filler 108 is provided on the memory module 100. A comparison of the average values with respect to the two temperature data reveals that the temperature may be dropped by 1.5° C. when the gap filler is provided on the memory module.

The effect of the temperature drop in the operating memory module may be improved when the epoxy or the tape is interposed between the socket and the mother board and/or when the socket pin is shaped and/or oriented to shorten the thermal conduction path. The grease 120 may also improve the temperature drop.

As discussed above, the operating temperature of the memory module may be lowered by decreasing the air gaps existing between the memory module and the socket. Lower operating temperatures may lessen degradation of the refresh characteristics of the semiconductor device, such as a DRAM (for example) mounted on the memory module.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:
1. A system comprising:
a socket including
a housing main body;
a module inserting portion provided in the housing main body; and at least one socket pin provided in the housing main body, the socket pin having an intermediate section confronting the module inserting portion of the housing main body; and a memory module including a printed circuit board (PCB);

tabs provided on opposing surfaces of an end of the PCB; and a semiconductor device mounted on the PCB;

wherein a tab of the memory module is inserted into the module inserting portion so that the tab is electrically connected to the socket pin;

wherein a heat conductive gap filler is provided between a surface of the module inserting portion and the PCB;

wherein a protrusion is provided on a side surface of the PCB; and wherein the tab is a printed circuit board pattern disposed in the PCB and the protrusion is a protruding part of the printed circuit pattern.

2. The system of claim 1, wherein the tabs engage opposing side surfaces of the module inserting portion of the housing main body.

3. A mounting method comprising:

mounting a socket on a mother board;

inserting a tab of a memory module into the socket;

providing a gap filler in a gap between the socket and an end of the memory module provided with the tab, the gap filler being electrically isolated; and forming a protrusion on a side surface of the memory module, wherein the protrusion contacts the socket to cover a gap between the memory module and a side surface of the socket, and the tab is formed of a printed circuit pattern and the protrusion is formed by protruding a portion of the printed circuit pattern.

4. The mounting method of claim 3, further comprising:

providing an epoxy between the socket and the mother board.

5. The mounting method of claim 3, wherein the gap filler is an electrically insulating grease.

6. The mounting method of claim 3, wherein the gap filler is provided on the bottom surface of the memory module.

7. The mounting method of claim 3, wherein the gap filler is provided on the bottom surface of the socket.

8. The mounting method of 3, wherein the protrusion is formed of a polymer.

9. A memory module comprising:

a printed circuit board (PCB);

a tab formed on an end of the PCB;

a semiconductor device mounted on the PCB; and a heat conductive gap filler attached to the end of the PCB provided with the tab, the gap filler being electrically isolated, wherein a protrusion is provided on a side surface of the PCB, and the tab is a printed circuit board pattern disposed in the PCB and the protrusion is a protruding part of the printed circuit pattern.

10. The memory module of claim 9, wherein the PCB includes a rigid substrate.

11. The memory module of claim 9, wherein the PCB includes a flexible substrate.

12. The memory module of claim 9, wherein the semiconductor device is one of a semiconductor package and a wafer lever package (WLP).

13. The memory module of claim 9, wherein the gap filler is bonded to the end of the PCB using an epoxy-based adhesive.

14. The memory module of claim 9, wherein a surface of the gap filler has no adhesive characteristics.

15. The memory module of claim 9, wherein a protrusion is fabricated from a polymer.

16. The memory module of claim 9, wherein the gap filler is fabricated from a gel material.

17. The memory module of claim 16, wherein a thickness of the gap filler is within a range of 0.1~0.4mm.

18. The memory module of claim 17, wherein the gap filler includes one of a silica-based filler and an aluminum oxide-based filler.

* * * * *